(12) United States Patent
Warntjes (10) Patent No.: US 8,643,363 B2
(45) Date of Patent: Feb. 4, 2014

(54) METHOD OF VISUALIZING SEGMENTED MR IMAGES WITH ABSOLUTE-SCALE VALUES INDEPENDENT OF MR SCANNER SETTINGS

(75) Inventor: Marcel Warntjes, Linköping (SE)

(73) Assignee: SyntheticMR AB, Linköping (SE)

( * ) Notice: Subject to any disclaimer, the term of this patent is extended or adjusted under 35 U.S.C. 154(b) by 639 days.

(21) Appl. No.: 12/626,705

(22) Filed: Nov. 27, 2009

(65) Prior Publication Data

US 2010/0127704 A1    May 27, 2010

Related U.S. Application Data

(60) Provisional application No. 61/118,446, filed on Nov. 27, 2008.

(51) Int. Cl.
*G01R 33/56* (2006.01)
*G01R 33/50* (2006.01)
*G01R 33/48* (2006.01)
*G06K 9/46* (2006.01)

(52) U.S. Cl.
USPC ........... 324/309; 382/131; 324/307; 324/312; 600/410

(58) Field of Classification Search
USPC .......... 600/407–435; 382/128–131, 132, 133; 436/520; 324/300–322
See application file for complete search history.

(56) References Cited

U.S. PATENT DOCUMENTS

| | | | |
|---|---|---|---|
| 4,634,979 A | 1/1987 | Riederer et al. | |
| 4,641,095 A | 2/1987 | Riederer | |
| 4,881,033 A | 11/1989 | Denison et al. | |
| 5,262,945 A | 11/1993 | DeCarli et al. | |
| 5,486,763 A | 1/1996 | Alfano | |
| 6,366,797 B1 | 4/2002 | Fisher et al. | |
| 6,823,205 B1 | 11/2004 | Jara | |
| 6,917,199 B2 | 7/2005 | Jara | |
| 6,937,014 B2 * | 8/2005 | Sun et al. | 324/303 |
| 7,002,345 B2 | 2/2006 | Jara | |
| 7,088,863 B2 * | 8/2006 | Averbuch et al. | 382/209 |
| 7,247,501 B2 * | 7/2007 | Kim et al. | 436/520 |
| RE42,367 E * | 5/2011 | Averbuch et al. | 382/209 |
| 7,973,530 B2 | 7/2011 | Warntjes | |
| 8,488,863 B2 * | 7/2013 | Boucheron | 382/133 |
| 2003/0214289 A1 * | 11/2003 | van Muiswinkel et al. | 324/307 |

(Continued)

OTHER PUBLICATIONS

R. Maitra et al., Bayesian Reconstruction in Synthetic Magnetic Resonance Imaging, Proc. SPIE, 1998, pp. 39-47, vol. 3459.

(Continued)

*Primary Examiner* — Melissa Koval
*Assistant Examiner* — Tiffany Fetzner
(74) *Attorney, Agent, or Firm* — Piedmont IP PLLC (57) ABSTRACT

A segmented MR image is provided by measuring a number of Magnetic Resonance Imaging parameters on an absolute scale. For example T1 relaxation, T2 relaxation and Proton Density PD can be measured on an absolute scale. The absolute values are then compared with known values for at least one type of tissue. For human tissue these parameters typically are in the order 300-4500 ms for T1, 50-1000 ms for T2 and 0-100% water for PD. Both T1 and T2 depend on the field strength. Based on a comparison between normal values for a particular type of tissue the values obtained for the image each pixel/voxel can be labeled with a certain probability that the voxel contains this type of tissue and segmented accordingly.

35 Claims, 6 Drawing Sheets

(56) References Cited

U.S. PATENT DOCUMENTS

| | | | |
|---|---|---|---|
| 2004/0057940 A1* | 3/2004 | Kim et al. | 424/93.21 |
| 2004/0189296 A1* | 9/2004 | Sun et al. | 324/306 |
| 2007/0053554 A1* | 3/2007 | Fayad et al. | 382/128 |
| 2007/0167727 A1 | 7/2007 | Menezes et al. | |
| 2009/0267945 A1* | 10/2009 | Warntjes | 345/440 |
| 2010/0103166 A1 | 4/2010 | Warntjes | |
| 2010/0111396 A1* | 5/2010 | Boucheron | 382/133 |
| 2010/0127704 A1* | 5/2010 | Warntjes | 324/309 |
| 2010/0260396 A1* | 10/2010 | Brandt et al. | 382/131 |
| 2011/0018537 A1 | 1/2011 | Warntjes | |

OTHER PUBLICATIONS

M. Prastawa et al., Synthetic Ground Truth for Validation of Brain Tumor MRI Segmentation, Med Image Comput Comput Assist Interv., 2005, pp. 26-33, 8 (Pt 1).

K.H. Cheng et al., In-vivo Tissue Characterization of Brain by Synthetic MR Proton Relaxation and Statistical Chisquares Parameter Maps, Proc. 8th Symposium on Computer-Based Medical Systems, 1995, pp. 338-345, IEEE.

M. Warntjes et al., Rapid Magnetic Resonance Quantification on the Brain: Optimization for Clinical Usage, Magnetic Resonance in Medicine, 2008, pp. 320-329, vol. 60, Wiley-Liss, Inc.

B. Grassiot et al., Quantification and Clinical Relevance of Brain Atrophy in Multiple Sclerosis: A Review, J. Neurol., 2009, pp. 1397-1412, vol. 256, Springer.

J. West et al., Novel Whole Brain Segmentation and Volume Estimation Using Quantitative MRI, Eur. Radiol., Nov. 24, 2011, pp. 1-10, Springer.

* cited by examiner

METHOD OF VISUALIZING SEGMENTED MR IMAGES WITH ABSOLUTE-SCALE VALUES INDEPENDENT OF MR SCANNER SETTINGS

This application claims the benefit of the filing date of U.S. Provisional Patent Application No. 61/118,446 filed on Nov. 27, 2009, which is incorporated here by reference.

TECHNICAL FIELD

The present invention relates to a method and a device for visualizing MR images. In particular the present invention relates to a method and a device for visualizing segmented MR images.

BACKGROUND

Magnetic Resonance Imaging (MRI) can generate cross-sectional images in any plane (including oblique planes). Medical MRI most frequently relies on the relaxation properties of excited hydrogen nuclei in water and fat. When the object to be imaged is placed in a powerful, uniform magnetic field the spins of the atomic nuclei with non-integer spin numbers within the tissue all align either parallel to the magnetic field or anti-parallel. The output result of an MRI scan is an MRI contrast image or a series of MRI contrast images.

In order to understand MRI contrast, it is important to have some understanding of the time constants involved in relaxation processes that establish equilibrium following Radio Frequency (RF) excitation. As the high-energy nuclei relax and realign, they emit energy at rates which are recorded to provide information about their environment. The realignment of nuclear spins with the magnetic field is termed longitudinal relaxation and the time (typically about 1 sec) required for a certain percentage of the tissue nuclei to realign is termed "Time 1" or T1. T2-weighted imaging relies upon local dephasing of spins following the application of the transverse energy pulse; the transverse relaxation time (typically<100 ms for tissue) is termed "Time 2" or T2. On the scanner console all available parameters, such as echo time TE, repetition time TR, flip angle $\alpha$ and the application of preparation pulses (and many more), are set to a certain value. Each specific set of parameters generates a particular signal intensity in the resulting images depending on the characteristics of the measured tissue.

Image contrast is then created by using a selection of image acquisition parameters that weights signal by T1, T2 or no relaxation time PD ("proton-density images"). Both T1-weighted and T2-weighted images as well as PD images are acquired for most medical examinations.

A purpose for MR images is to serve as a tool in medical examinations and to aid in establishing a correct diagnosis. For example MR images can be used to find pathological tissue. As is known in the art from e.g. U.S. Pat. No. 7,136,516 during a MR imaging session, the patient is placed inside a strong magnetic field generated by a large magnet. Magnetized protons within the patient, such as hydrogen atoms, align with the magnetic field produced by the magnet. A particular slice of the patient is exposed to radio waves that create an oscillating magnetic field perpendicular to the main magnetic field. The slices can be taken in any plane chosen by the physician or technician performing the imaging session. The protons in the patient's body first absorb the radio waves and then emit the waves by moving out of alignment with the field. As the protons return to their original state (before excitation), diagnostic images based upon the waves emitted by the patient's body are created. The MR image slices are reconstructed to provide an overall picture of the body area of interest. Parts of the body that produce a high signal are displayed as white in an MR image, while those with the lowest signals are displayed as black. Other body parts that have varying signal intensities between high and low are displayed as some shade of gray.

Based on an initial set of MR images the anatomy may be segmented. The segmentation process classifies the pixels or voxels of an image into a certain number of classes that are homogeneous with respect to some characteristic (i.e. intensity, texture, MR parameter values, etc.). For example, in a segmented image of the brain, the material of the brain can be categorized into three major classes: gray matter, white matter, and cerebrospinal fluid. Individual colors can be used to mark regions of each class after the segmentation has been completed. Once the segmented image is generated it can be used for different purposes. For example surgeons can use the segmented images to plan surgical techniques. Another example is quantitative follow-up of the brain tissue volume in case of neuro-degenerative diseases.

Furthermore in the international patent application WO2008/082341, a method and a system for synthetic generation of MR images is disclosed. The method relies on computed values for different parameters of an MR image. In particular the parameters T1, T2 and PD are used.

There is a constant demand to improve the information that can be deduced from an MR image. Hence there is a need for an improved method and system for visualizing MR images.

SUMMARY

It is an object of the present invention to provide a method and a system enabling improved visualizing of MR images.

This object and others are obtained by the present invention as set out in the appended claims. Hence in accordance with the present invention a number of Magnetic Resonance Imaging parameters are measured on an absolute scale. For example T1 relaxation, T2 relaxation and Proton Density PD can be measured on an absolute scale. The absolute values are then compared with known values for at least one type of tissue. For human tissue these parameters typically are in the order 300-4500 ms for T1, 50-1000 ms for T2 and 0-100% water for PD. Both T1 and T2 depend on the field strength. Based on a comparison between normal values for a particular type of tissue the values obtained for the image each pixel/voxel can be labeled with a certain probability that the voxel contains this type of tissue. The range of probability varies between 0 and 1. In accordance with one embodiment the comparison can be made for a group or cluster of pixels/voxels.

In accordance with one embodiment absolute parameters can be visualized in a 2-dimensional quantitative plot containing for example two of the three, e.g., T1 as a function of T2 or T1 as a function of PD where the values are used as coordinates in the plot. Alternatively the relaxation rate can be taken on the axes where the rate R1 corresponds to 1/T1 and R2 to 1/T2. Alternatively any equation containing T1, T2 or PD can be used on the axes. Since each tissue has its unique combination of absolute parameters the typical position of a tissue can be indicated in this plot. Since all measurements contain a noise distribution this position indication will have a certain size. All image pixels that contain a specific tissue will be positioned inside this tissue cluster indication.

If a voxel contains two kinds of tissue it will exhibit values that have a position on a line between the two respective cluster positions. These lines can be indicated as well in the quantitative tissue plot. Reference values for tissue clusters can be obtained from a group of healthy volunteers.

A quantitative tissue plot cannot be based on conventional T1- and T2-weighted images since the scaling of these images is arbitrary and hence the reference clusters cannot be set.

Furthermore, if a voxel exhibits parameter values that are not located in a cluster position and not in the vicinity of the line between two cluster positions the voxel likely does not contain normal healthy tissue and should hence be classified as containing pathological tissue. An image where only these voxels are displayed, i.e. the probability of not containing healthy tissue, acts as a sort of pathology map. Showing this map or, alternatively, overlaying this map over an MR image, will be a support for the radiologist in his diagnosis The multiplication of the pathology probability times the voxel volume (for the complete covered volume or a part thereof) results in the estimation of total pathology volume. Alternatively the total volume may be counted as all voxels containing more that a certain threshold value. The calculated total pathology volume may be shown to the user which is another support for diagnosis of patient status.

BRIEF DESCRIPTION OF THE DRAWINGS

The present invention will now be described in more detail by way of non-limiting examples and with reference to the accompanying drawings, in which.

DETAILED DESCRIPTION

Figure 1:
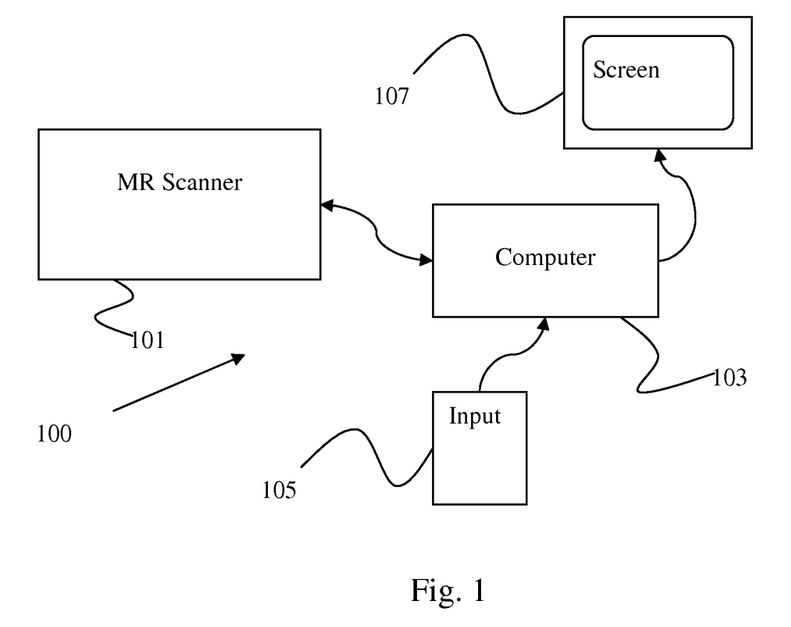
FIG. 1 is a general view of a MRI system.

In FIG. 1 a general view of a setup of a MRI system 100 is depicted. The system 100 comprises a MR scanner 101. The MR scanner is operative to generate MRI data by means of scanning a living object. The MR scanner is further connected to a computer 103 for processing data generated by the scanner 101. The computer comprises a central processor unit coupled to a memory and a number of input and output ports for receiving and outputting data and information. The computer 103 receives input commands from one or several input devices generally represented by an input device 105. The input device may be one or many of a computer mouse, a keyboard, a track ball or any other input device. The computer 103 is further connected to a screen 107 for visualizing the processed scanner data as a contrast image.

Figure 2:
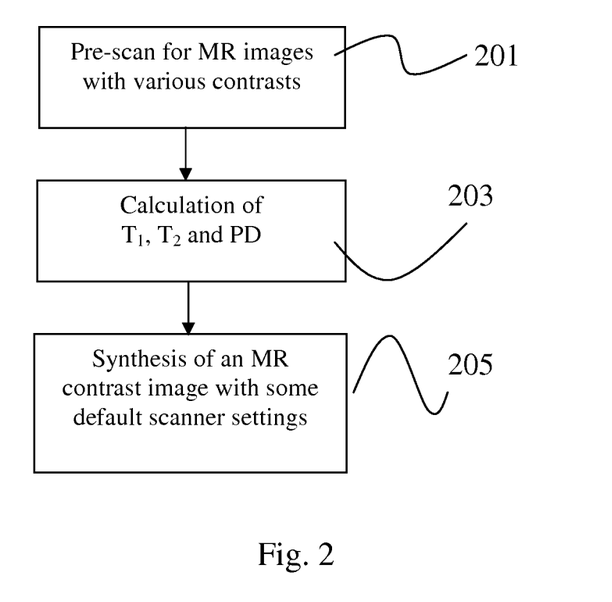
FIG. 2 is a flowchart illustrating steps performed when generating contrast images.

In FIG. 2, a flowchart illustrating steps performed when generating contrast images is shown. First in a step 201 a pre-scan is performed to acquire several MR images of a patient with various contrasts. Next, in a step 203 the images generated in step 201 are used to determine the patient specific parameters. In particular the $T_1$ relaxation time, the $T_2$ relaxation time and the Proton Density (PD), or for some applications a subset thereof, is determined. The method for determining the patient specific $T_1$ relaxation time, $T_2$ relaxation time and Proton Density (PD) can be any suitable method. However it is preferred to use a fast method to reduce the overall time of an examination Using the pre-scan information any MR contrast image can be synthesized. This is because the intensity in the synthesized contrast images is a function of the patient specific parameters as well as freely chosen MR scanner parameters such as echo time (TE), repetition time (TR), RF flip angle and inversion pulse delay time TI. Equations for the calculation of the expected intensity can be found in Haacke, E M, Brown R W, Thompson M R, Venkatesan R. Magnetic Resonance Imaging, physical principles and sequence design. ISBN 0-471-35128-8 J. Wiley & Sons. Practical examples of methods for contrast image synthesis are described in Gulani V, Schmitt P, Griswold M, Webb A G, Jakob P M. Towards a single-sequence neurologic magnetic resonance imaging examination: multiple-contrast images from an IR TrueFISP experiment. Invest Radiol 2004:39; 767-74. and Zhu X P, Hutchinson C E, Hawnaur J M, Cootes T F, Taylor C J, Isherwood I. Magnetic resonance image synthesis using a flexible model. Br J Radiol 1994:67; 976-82.

Next in a step 205, an arbitrary initial MR contrast image is synthesized using some default scanner parameter settings as a starting point for generating such an initial contrast image.

In accordance with one embodiment of the present invention segmentation of tissue is based on multiple parameters simultaneously. Possible MR parameters that can be used for segmentation are the absolute T1 and T2 relaxation, the proton density PD and the apparent diffusion constant ADC. Alternatively a parameter can be derived from any of these, for example the relaxation rate R1 (=1/T1) or R2 (=1/T2).

The parameters are given an absolute scaling, i.e. the value for the parameter for a specific tissue is identical for different scans and different patients as long as there is no pathological change in the tissue. For example based on studies it can be determined that healthy white matter in the brain that typically has T1=570 ms, T2=75 ms and a PD=65% at 1.5 Tesla. Due to noise and tissue heterogeneity a certain width of values can still be considered as consisting completely of that particular tissue. For example white matter can be determined to exist in the region T1=[550-580] ms, T2=[73-78] ms and PD=[63-67]%.

The parameter values can for example be generated from a synthetic MR image. A synthetic MR image can for example be obtained as described in the international patent application WO2008/082341.

Figure 3:
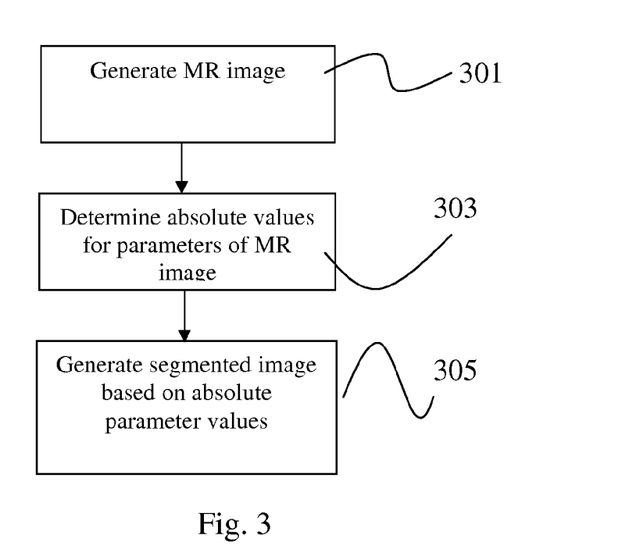
FIG. 3 is a flow chart illustrating steps performed when generating a segmented MR image.

In FIG. 3 a flow chart illustrating steps performed when generating a segmented image in accordance with the above is shown. First in a step 301 an MR image is generated. For example a synthetic image as described above can be used. Next in a step 303 absolute values for at least two parameters of the MR image are obtained. Based on the absolute values and reference data for different types of tissue a segmented MR image is then generated in a step 305. Values for the tissue coordinates and the width around it can be retrieved using a group of healthy volunteers.

In accordance with one embodiment each MR parameter used to classify an MR image segment such as an MR pixel or MR voxel can be considered an axis in a multi-dimensional space. Since the value of a specific tissue for each parameter is identical each tissue can be defined as a specific coordinate in this space. For example pure white matter at 1.5T would be (T1, T2, PD)=(570, 75, 65)). A line can be defined in this space between two separate tissues A and B where at one end there is 100% of A and 0% of B and on the other end 100% of B and 0% of A. Along this line the fractional volume can be defined where both A and B are in the range [0-100%] with the condition that A+B=100%. This is shown in FIG. 4.

Figure 4:
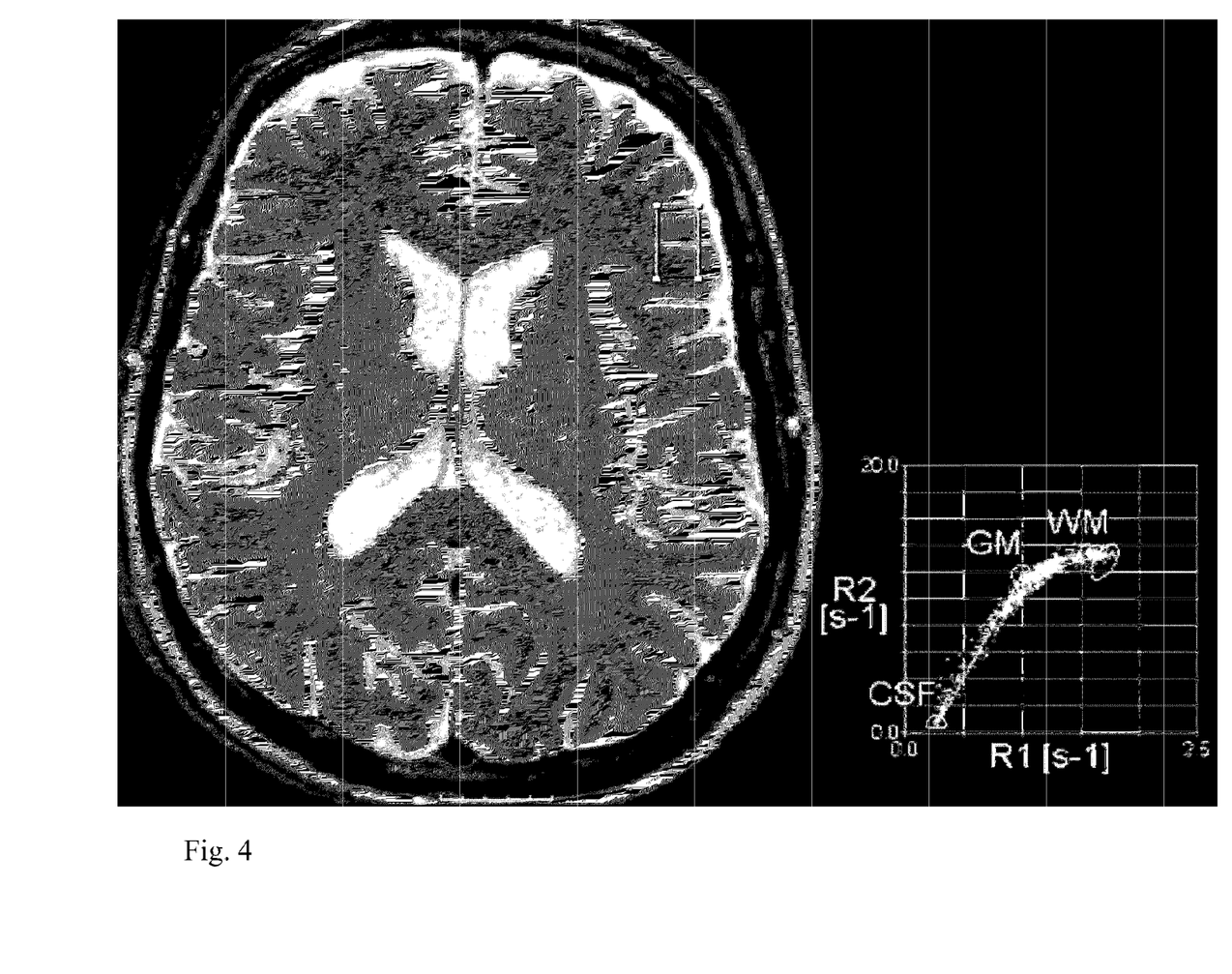
FIG. 4 is an exemplary display of a segmented image.

In FIG. 4 a practical example for visualization of quantitative MRI data by means of a quantitative tissue plot is shown. A conventional or quantitative MR image of the brain is displayed together with an indication of a Region of Interest (ROI) which covers a number of pixels up to the complete image (the square on the image). The absolute values of the pixels inside the ROI are displayed in the quantitative tissue plot on the right. The absolute pixel values R1 and R2 are used as coordinates in that plot. In this way the user can, with the help of the indicated tissue cluster position and the connecting lines, verify whether the indicated pixels contain healthy tissue or pathology. In this case all pixels are on the lines between CerebroSpinal Fluid (CSF) to Grey Matter (GM) and on the line Grey Matter (GM) to White Matter (WM), meaning there is no indication of pathology inside the ROI.

In another embodiment R1 can be plotted as a function of PD. This plot would indicate clearly the relation between R1 and water content of the tissue (this is a line crossing the axes at PD=105% and R1=4.5). Another benefit of such a plot would be the indication of fat which has completely different values than water en hence will be far of the mentioned line. Using these plots will assist software to segment the various tissue types automatically.

Figure 5A:
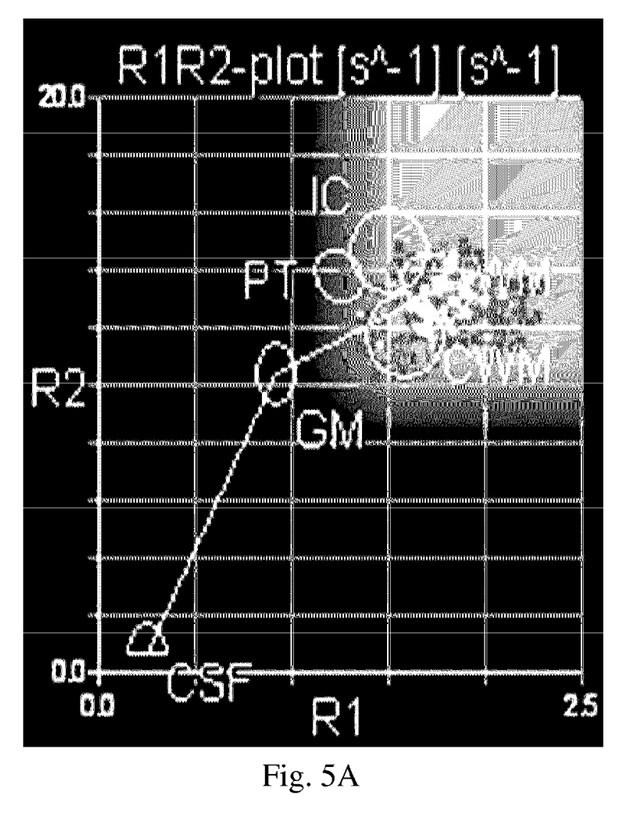
FIGS. 5A, 5B, 5C are exemplary image displays of segmented images.
Figure 5B:
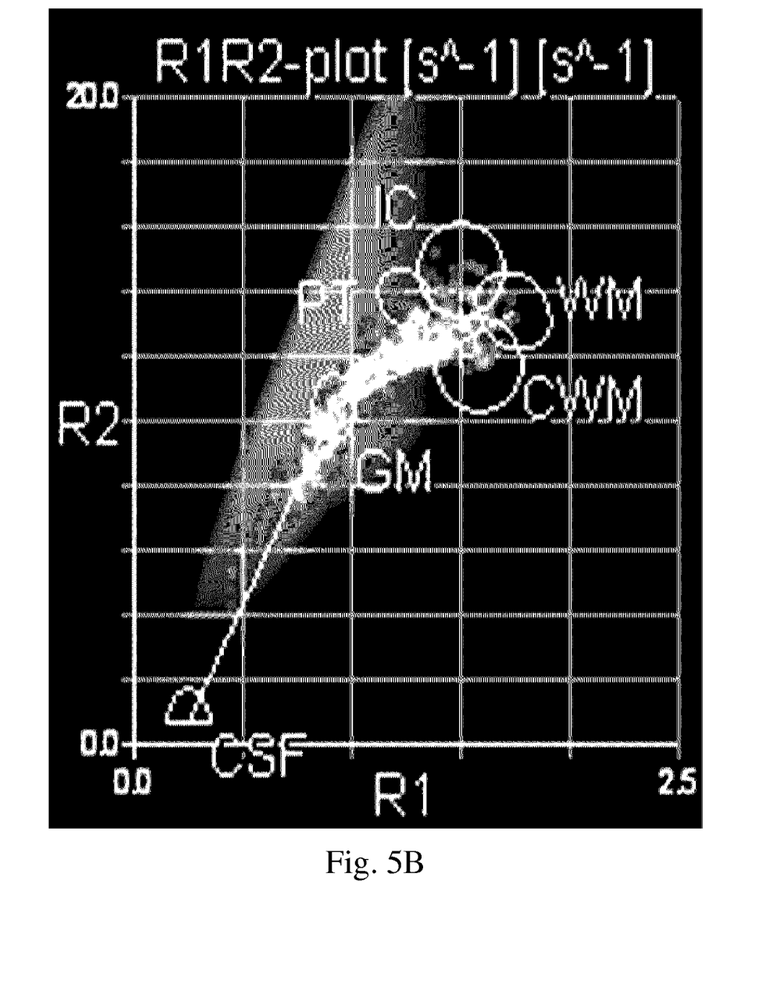
Figure 5C:
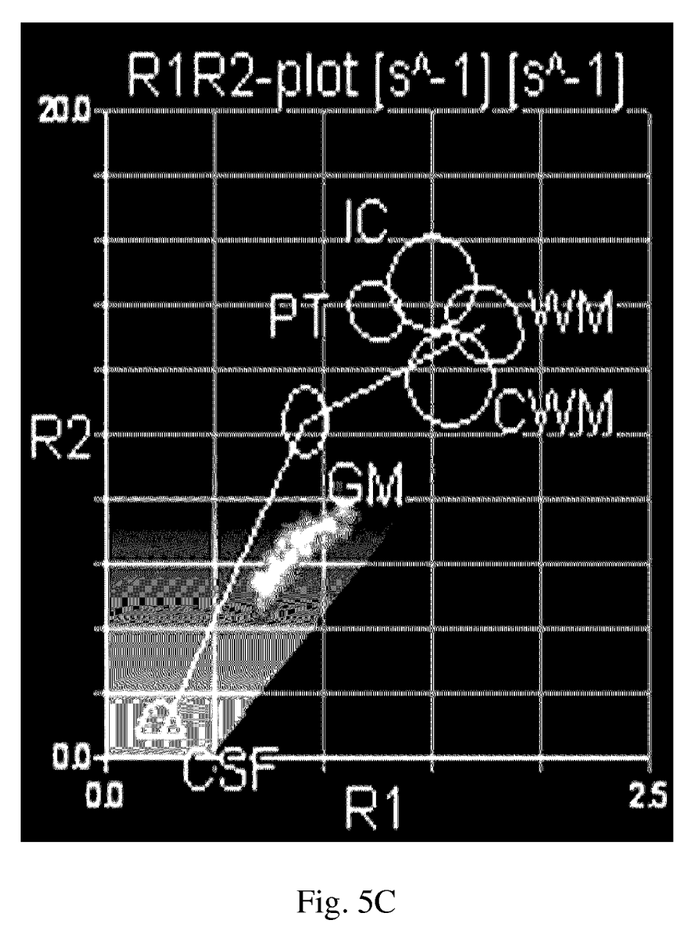

In FIGS. 5A, 5B, 5C, plots with R1 and R2 for the brain are shown. The reference cluster regions of healthy CSF, GM, subcortical WM, central WM (CWM), putamen (PT) and internal capsule (IC) in a relaxation rate plot of R1 versus R2 (a projection of the R1-R2-PD space). The light-shaded areas, which can be different colors with varying transparency and intensity, show the probability regimes of WM, GM and CSF. The quantitative data inside some ROIs are also plotted as individual data points. The tumor data points are positioned significantly off-line from the partial volume connectivity between CSF and GM. Hence it seems to contain partly CSF, but no WM or GM.

An example for the calculation of the fraction of A and B is to assume a linear relationship in space, where the center of A is at $A_i$ where i corresponds to the set of axes and the center of B is at $B_i$. The distance D between the two tissues A and B in the multi-dimensional space is $$D = \sqrt{\sum_i (B_i - A_i)^2}$$

Any data point X, in the space can be projected on the line between A and B by taking the component parallel with this line. The distance of the projected data point to A, can be normalized by dividing by the total distance D, resulting in the fraction of tissue A in the observed tissue X. Likewise the distance from the projected data point to $B_i$ can be normalized by dividing with the total distance D, resulting in the fraction of tissue B in the observed tissue X.

In accordance with another embodiment the space is 3-dimensional with the three axes R1, R2 and PD. Also a corresponding plot can be generated and displayed. For example if White matter is at the coordinate (R1, R2, PD)=(1.75, 13.3, 65) and grey matter is at the coordinate (R1, R2, PD)=(0.95, 11.7, 85). An observed voxel with the values (R1, R2, PD)= (1.35, 12.5, 75) is calculated to contain 50% white matter and 50% grey matter since it is precisely in the middle of the line between white and grey matter.

In accordance with one embodiment tissue fraction calculation can be performed on the line between tissues A and B where the fraction is calculated non-linearly. In that case the coordinate of 50% A and 50% B may lie closer to A or to B than precisely in the middle.

In accordance with one embodiment noise characteristics is included in the fraction calculation. A simple linear fractional calculation assumes only a single point in the space that corresponds to 100% tissue. Since the measured data contains noise the data points will likely be spread around the center value leading to an underestimation of the tissue. This can be improved by convolution of the line with a Gaussian of a specific width. This means that if a data point is in the geometrical vicinity of the line, but not on the line, it may still be assigned a high probability of a certain tissue type. In accordance with one embodiment an additional fractional factor based on the distance of the data point perpendicular to the line where the fraction decreases with increasing (perpendicular) distance to the line is added. Any data point X, in the space can be projected on the line between tissues A and B by taking the component parallel with this line. The distance of the projected data point to A, can be normalized by dividing by the total distance D, resulting in the fraction of tissue A in the observed tissue X. This fraction f is multiplied by a factor that decreases with increasing perpendicular distance r from the line, e.g. $f=\exp(-r^2)$ The visualizing method and device as described herein is not limited to a specific number of tissue types. In fact the inventor has envisaged including any number of tissue coordinates where lines can be drawn between each set of two tissues.

In accordance with one embodiment of the present invention a view of pathological tissue can be generated by displaying all image segments determined to correspond to healthy tissue as one type and remaining image segments as another type. For example healthy tissue can be made black and other tissue can be displayed as white or any other suitable coloring. Hence by first determining a set of known tissues and the respective fractional calculations and subsequently taking the complete object and removing these determined tissues. What is left is the unknown part which may be pathologic and can be studied further.

As an example the complete brain can be taken, subsequently the white matter, grey matter, the blood vessels and cerebrospinal fluid can be removed. The remaining tissue in the resulting image has a high chance of being pathologic, e.g. Multiple Sclerosis or a tumor.

Tissue characterized as pathology may be further divided into specific types of pathologies. An example is to specify brain tumors into specific T1-T2-PD distributions for astrocytoma, meningioma and oligodendroma. Another example is various states of Multiple Sclerosis lesions into inflammated, active and burned out.

A specific example of a single tissue that can be segmented is fat. At 1.5T fat has been estimated at (T1, T2, PD)=(300, 90, 150). Hence the fat single has 150% the signal intensity as pure water. Using the fraction calculation towards e.g. muscle (at about (T1, T2, PD)=(850, 50, 65)) fat can be segmented. The invention includes a method to first determine the fractional tissue calculation of fat and subsequently removing that fraction from the MR image resulting in a fat-suppressed image.

Another specific example of a single tissue that is of high clinical interest is the absolute calculation of myelin related volume. White matter in the brain exhibits a certain degree of myelinization that may change with position or patient age. Myelin may not be observed by quantification sequences directly due to it high relaxation rate but it may alter the observed R1, R2, PD combination depending on it fractional volume. A relative increase of myelin related volume can be observed indirectly as a decrease of measured PD and a simultaneous increase of both R1 and R2. Assuming that pure grey matter contains no myelin the myelin volume fraction MyV for each voxel i can be calculated as the relative PD difference compared to the PD of grey matter or as the scaled relative R1 difference compared to the R1 of grey matter:

$$MyV_i = PD_{GM} - PD_i = \frac{R_{1,i} - R_{1,GM}}{R_{1,MyW} - R_{1,GM}}$$

Another specific example of a single tissue that is of high clinical interest is the absolute calculation of inflammation degree. An inflammatory reaction changes the ratio between intracellular and extracellular water (cells swell) resulting in a lower R2 relaxation rate. The difference of R2 with the normal, healthy value of R2 can be used to indicate the degree of inflammation I for each voxel i e.g. as:

$$I_i = A(R_{2,normal} - R_{2,i})$$

where A is a scaling factor

In accordance with one embodiment additional geometrical considerations are also made. It may be that the coordinates X of a certain mixture of tissue A and B coincide with a certain mixture of tissue C and D. In that case the neighboring voxels can be examined whether they correspond mostly of a combination of tissue A and B or mostly of tissue C and D. If the majority of the neighboring voxels comprises of A and B then the tissue X will be considered a mixture of A and B as well, if the majority of the neighboring voxels comprises of C and D then the tissue X will be considered a mixture of C and D. Also the display of color in the quantification plot can be set so that the color intensity corresponds to the probability of a certain tissue. For example the higher the probability that a particular image segment such as a pixel or voxel is determined to be a particular tissue type the higher the intensity of the color of that particular image segment.

In accordance with one embodiment the user may himself indicate a point in the R1-R2-PD space (or any related space spanned by quantified parameters). Data that lies within a certain range around the indicated point is highlighted in an image. In another exemplary embodiment the user can indicates the allowed range of data. This will help the user to find tissue that is similar to the indicated tissue.

In order to enhance the display of images the grey scale or color can be set to correspond to the fractional component of a single tissue. Hereby a more comprehensive view of the displayed image can be obtained.

In accordance with one embodiment multiple tissues are shown simultaneously in a displayed view. Each tissue can be set to a particular color. In addition transparence of the color can be based on the fractional component of a tissue.

The invention includes the display of synthetic or conventional MR images where a semi-transparent color overlay indicates the fractional component of a specific tissue. Each specific tissue has its own color and the transparency indicates the fractional component.

In one embodiment the display of synthetic or conventional MR images can be set to comprise a semi-transparent color overlay that indicates the remaining fraction of tissue after removal of all healthy tissue.

Also reading of multiple data sets leading to multiple sets of MR parameters can be included. These multiple parameter sets can be subtracted resulting in the difference values. Display of the difference values can be shown in a similar way as tissue images. This implementation is important with examinations that make use of administrating contrast media. These media result in changes of the MR parameters.

Figure 6:
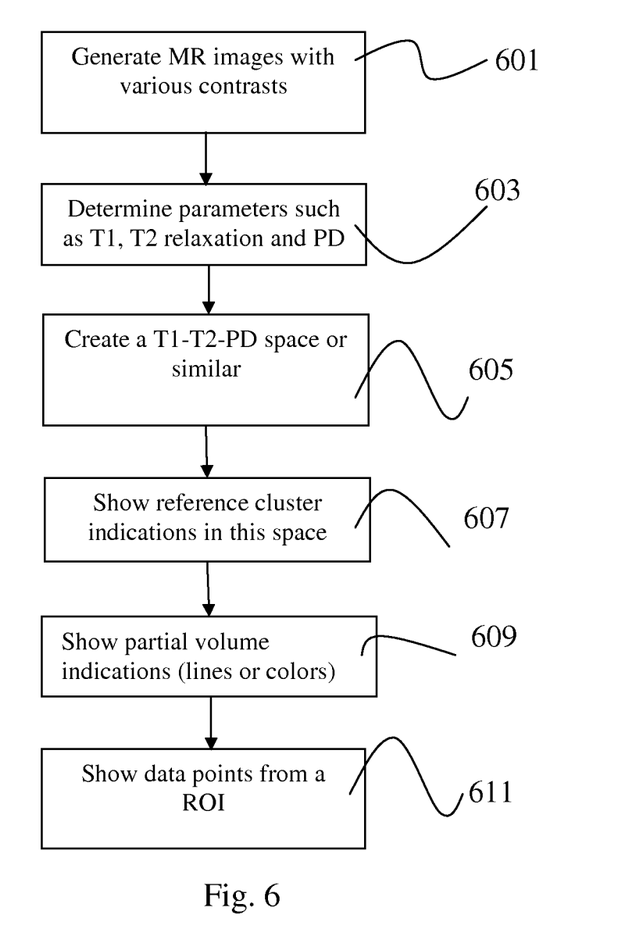
FIG. 6 is a flow chart illustrating some procedural steps performed when generating a segmented image.

In FIG. 6 a flowchart illustrating some procedural steps that can be performed when visualizing a segmented image in accordance with the above is depicted. First in a step 601 MR images with various contrasts are generated. Next, in a step 603, the set of images generated in step 601 are used to determine different MR parameters of the image such as T1, T2 and PD. For example the MR parameters for each pixel or voxel of the image are determined. Next, in a step 605, the values are displayed in as suitable space such as a plot. Next, in a step 607 reference clusters of known values for different tissue types are displayed in the space. Next, in a step 609 partial values are also displayed in the space, for example by using lines or by color-coding depending on how the space is represented in a display. Next, in a step 611 a user can select a particular region of interest in the MR image and the values of the pixels/voxels of that region are displayed in the space.

The examples above have described segmentation of MR brain images. The method and system is equally well suited for generating segmented MR images of other objects including other parts of a human or mammal body. For example in the case a segmented view of a knee is generated the reference tissue can be reference cluster regions of healthy muscle, fat, bone, ligaments, glands, veins or arteries for other anatomies.

The methods of displaying segmented image can preferably be computer implemented by executing software, stored on a digital storage media and loadable into the computer, adapted to perform the described method steps on a computer for generating MR images. Using the method, computer program and imaging system as described herein will improve ability to use segmented images as a tool and aid for setting diagnosis and to aid in surgical procedures among other areas of application.

It will be appreciated that procedures described above are carried out repetitively as necessary. To facilitate understanding, many aspects of this invention are described in terms of sequences of actions that can be performed by, for example, elements of a programmable computer system. It will be recognized that various actions could be performed by specialized circuits (e.g., discrete logic gates interconnected to perform a specialized function or application-specific integrated circuits), by program instructions executed by one or more processors, or by a combination of both.

Moreover, this invention can additionally be considered to be embodied entirely within any form of computer-readable storage medium having stored therein an appropriate set of instructions for use by or in connection with an instruction-execution system, apparatus, or device, such as a computer-based system, processor-containing system, or other system that can fetch instructions from a medium and execute the instructions. As used here, a "computer-readable medium" can be any means that can contain, store, or transport the program for use by or in connection with the instruction-execution system, apparatus, or device. The computer-readable medium can be, for example but not limited to, an electronic, magnetic, optical, electromagnetic, infrared, or semiconductor system, apparatus, or device. More specific examples (a non-exhaustive list) of the computer-readable medium include an electrical connection having one or more wires, a portable computer diskette, a random-access memory (RAM), a read-only memory (ROM), an erasable programmable read-only memory (EPROM or Flash memory), and an optical fiber.

Thus, the invention may be embodied in many different forms, not all of which are described above, and all such forms are contemplated to be within the scope of the invention. For each of the various aspects of the invention, any such form may be referred to as "logic configured to" perform a described action, or alternatively as "logic that" performs a described action.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. A method of generating, with a processor, a segmented image of a subject based on a number of magnetic resonance (MR) images of the subject, the method comprising:
   generating values on an absolute scale of at least two parameters indicative of tissue type in the number of MR images for each pixel/voxel of the number of MR images, wherein the absolute-scale values are independent of MR scanner settings, and
   segmenting the generated absolute-scale values of the pixels/voxels in the number of MR images according to tissue type; and
   generating, by the processor, the segmented image of the subject, in a viewable form, based on the segmented absolute-scale values.

2. The method of claim 1, wherein the pixels/voxels of the number of MR images are grouped into clusters of a predetermined size and the method includes generating absolute-scale values for each cluster group.

3. The method of claim 1, wherein the at least two parameters include, or are based on, at least one of: T1 relaxation, T2 relaxation, Proton Density PD and Apparent Diffusion Coefficient (ADC), Fractional Anisotropy (FA) and Magnetization Transfer (MT).

4. The method of claim 1, wherein segmenting the generated absolute-scale values includes comparing the generated absolute-scale values, to a set of normal values, of a particular type of tissue, with the comparing resulting in a tissue probability image.

5. The method of claim 1, wherein the at least two parameters indicative of tissue type are visualized in a 2-dimensional plot.

6. The method of claim 5, wherein the at least two parameters indicative of tissue type of a selected Region of Interest are visualized in the 2-dimensional plot.

7. The method of claim 5, wherein positions of the at least two generated absolute scale parameter values, corresponding to specific types of tissues are indicated in the 2-dimensional plot.

8. The method of claim 7, wherein lines between different positions, of the at least two generated absolute scale parameter values, corresponding to specific types of tissues, are indicated in the 2-dimensional plot.

9. The method of claim 7, wherein the tissue types indicated in the 2-dimensional plot include at least one of: reference cluster regions of healthy CerebroSpinal Fluid (CSF), Gray Matter (GM), subcortical White Matter (WM), central WM (CWM), putamen (PT) and internal capsule (IC), muscle, fat, bone, ligaments, glands, veins or arteries, Myelin, inflammation.

10. The method of claim 4, wherein tissue not corresponding to healthy tissue is displayed in the generated segmented image.

11. The method of claim 10, wherein tissue not corresponding to healthy tissue is further displayed as a specific pathological tissue in the generated segmented image.

12. The method of claim 4, wherein all image segments determined to correspond to healthy tissue are displayed as one type of tissue and remaining image segments are displayed as another type of tissue.

13. The method of claim 4, wherein user input is used in order to select a reference cluster position, and where a range of values is set as default values.

14. The method of claim 4, wherein user input is used in order to select a reference cluster position, and in order to select a range of values.

15. The method of claim 1, wherein all segments, in the generated segmented image, are color coded with respect to tissue type.

16. The method of claim 15, wherein a transparency of a color code is set in order to correspond to the fractional component(s) of a tissue type.

17. The method of claim 15, wherein color intensity is set to correspond in order to a probability of a particular tissue type.

18. A system configured for generating, with a processor, a segmented image of a subject based on a number of magnetic resonance (MR) images of the subject, comprising:
    an absolute value generator configured to generate values on an absolute scale of at least two parameters indicative of tissue type in the number of MR images for each pixel/voxel of the number of MR Images, wherein the absolute-scale values are independent of MR scanner settings, and
    a segmenter configured to segment the generated absolute-scale values of the pixels/voxels in the number of MR images according to tissue types; and
    an image generator configured to generate, by the processor, the segmented image of the subject, in a viewable form, based on the segmented absolute-scale values.

19. The system of claim 18, wherein the pixels/voxels of the number of MR images are grouped into clusters of a predetermined size, and absolute-scale values are generated for each cluster group.

20. The system of claim 18, wherein the at least two parameters include or are based on, at least one of: T1 relaxation, T2 relaxation, Proton Density PD and the Apparent Diffusion Coefficient (ADC), Fractional Anisotropy (FA) and Magnetization Transfer (MT).

21. The system of claim 18, wherein the segmenter is configured to compare the generated absolute-scale values, to a set of normal values, of a particular type of tissue, with a tissue probability image being generated based on the comparison.

22. The system of claim 18, wherein the system is configured to visualize the at least two parameters, indicative of tissue type, in a 2-dimensional plot.

23. The system of claim 22, wherein the system is configured to visualize the at least two parameters, indicative of tissue type of a selected Region of Interest in the 2-dimensional plot.

24. The system of claim 22, wherein the system is configured to indicate positions of the at least two generated absolute scale parameter values, corresponding to specific types of tissues in the 2-dimensional plot.

25. The system of claim 24, wherein the system is configured to indicate lines between different positions, of the at least two generated absolute scale parameter values, corresponding to specific types of tissues in the 2-dimensional plot.

26. The system of claim 24, wherein the tissue types indicated in the 2-dimensional plot include at least one of: reference cluster regions of healthy CerebroSpinal Fluid (CSF), Gray Matter (GM), subcortical White Matter (WM), central WM (CWM), putamen (PT) and internal capsule (IC), muscle, fat, bone, ligaments, glands, veins or arteries, Myelin, inflammation.

27. The system of claim 21, wherein the system is configured to display tissue, not corresponding to healthy tissue, in the generated segmented image.

28. The system of claim 27, where the system is configured to display tissue, not corresponding to healthy tissue, as a specific pathological tissue in the generated segmented image.

29. The system of claim 21, wherein the system is configured to display, in the generated segmented image, all image segments determined to correspond to healthy tissue as one type of tissue, and in order to display remaining image segments as another type of tissue.

30. The system of claim 21, wherein the system is configured to receive user input in order to select a reference cluster position, and where the range of values is set as default values.

31. The system of claim 21, wherein the system is configured to receive user input in order to select a reference cluster position and in order to select the range of values.

32. The system of claim 18, wherein the system is configured to color code all segments with respect to tissue type.

33. The system of claim 32, wherein the system is configured to set transparency of a color code in order to correspond to the fractional component(s) of a tissue type.

34. The system of claim 32, wherein the system is configured to set color intensity in order to correspond to the probability of a particular tissue type.

35. A digital storage medium having instructions that, when executed by a computer, cause the computer to perform a method of generating, with the computer, a segmented image of a subject based on a number of magnetic resonance (MR) images of the subject, wherein the method comprises:
generating values, on an absolute scale, of at least two parameters indicative of tissue type in the number of MR images for each pixel/voxel of the number of MR images, wherein the absolute-scale values are independent of MR scanner settings, and
segmenting the generated absolute-scale values of the pixels/voxels in the number of MR images according to tissue type; and
generating, with the computer, the segmented image of the subject, in a viewable form, based on the segmented absolute-scale values.

\* \* \* \* \*